United States Patent
Tu

(10) Patent No.: US 8,445,958 B2
(45) Date of Patent: May 21, 2013

(54) POWER SEMICONDUCTOR DEVICE WITH TRENCH BOTTOM POLYSILICON AND FABRICATION METHOD THEREOF

(75) Inventor: Kao-Way Tu, New Taipei (TW)

(73) Assignee: Great Power Semiconductor Corp., New Taipei (TW)

( * ) Notice: Subject to any disclaimer, the term of this patent is extended or adjusted under 35 U.S.C. 154(b) by 103 days.

(21) Appl. No.: 13/083,507

(22) Filed: Apr. 8, 2011

(65) Prior Publication Data

US 2011/0298042 A1 Dec. 8, 2011

(30) Foreign Application Priority Data

Jun. 7, 2010 (TW) ................................. 99118429 A

(51) Int. Cl.
*H01L 21/336* (2006.01)
(52) U.S. Cl.
USPC ........................................................ 257/330
(58) Field of Classification Search
CPC ...................... H01L 21/76204; H01L 21/76221
USPC ........................ 257/330, 331; 438/268–270
See application file for complete search history.

(56) References Cited

U.S. PATENT DOCUMENTS

| | | | |
|---|---|---|---|
| 8,247,874 B2 * | 8/2012 | Hirler et al. .................... | 257/392 |
| 2005/0189585 A1 * | 9/2005 | Jones ............................. | 257/330 |
| 2005/0224871 A1 * | 10/2005 | Ma .................................. | 257/330 |
| 2006/0006460 A1 * | 1/2006 | Zeng .............................. | 257/330 |
| 2006/0027861 A1 * | 2/2006 | Takaishi ......................... | 257/330 |
| 2006/0065926 A1 * | 3/2006 | Kubo et al. .................... | 257/330 |
| 2008/0150020 A1 * | 6/2008 | Challa et al. .................. | 257/331 |
| 2009/0189218 A1 * | 7/2009 | Pan ................................ | 257/330 |

* cited by examiner

*Primary Examiner* — Nathan Ha
(74) *Attorney, Agent, or Firm* — Li & Cai Intellectual Property (USA) Office

(57) ABSTRACT

A power semiconductor device comprising a base, a trench, a heavily doped polysilicon structure, a polysilicon gate, a gate dielectric layer, and a heavily doped region is provided. The trench is formed in the base. The heavily doped polysilicon structure is formed in the lower portion of the trench. At least a side surface of the heavily doped polysilicon structure touches the naked base. The polysilicon gate is located in the upper portion of the trench. The gate dielectric layer is interposed between the polysilicon gate and the heavily doped polysilicon structure. The dopants in the heavily doped polysilicon structure are diffused outward to form a heavily doped region.

17 Claims, 6 Drawing Sheets

POWER SEMICONDUCTOR DEVICE WITH TRENCH BOTTOM POLYSILICON AND FABRICATION METHOD THEREOF

BACKGROUND OF THE INVENTION (1) Field of the Invention

This invention relates to a power semiconductor device and a fabrication method thereof, and more particularly relates to a power semiconductor device with trench bottom heavily-doped polysilicon structures and a fabrication method thereof.

(2) Description of the Prior Art

In contrast with traditional planar power semiconductor device which features horizontal conductive current flowing along the surface layer of the base, the trenched power semiconductor device has the gate electrode embedded in a gate trench to change the direction of gate channel so as to generate a vertical conductive current flow. Therefore, size of the unit cell of the power semiconductor devices can be reduced to enhance cell integration. The power semiconductor devices commonly used in power industry include metal oxide semiconductor field effect transistor (MOSFET), insulated gate bipolar transistor (IGBT), and etc.

Energy loss of power semiconductor devices can be sorted as conducting loss due to conductive resistance and switching loss resulted from gate charge. It is well known that switching loss can be improved by reducing input capacitance (Ciss) and reverse transfer capacitance (Crss) of the power semiconductor device. However, in order to reduce input capacitance (Ciss) and reverse transfer capacitance (Crss), the fabrication process usually becomes quite complicated and the fabrication cost is thus increased.

Accordingly, it is an important issue in the art to figure out a simpler method, which may reduce input capacitance (Ciss) and reverse transfer capacitance (Crss) of the power semiconductor devices and can be applied to the present power semiconductor fabrication process easily.

SUMMARY OF THE INVENTION

It is a main object of the present invention to reduce input capacitance and reverse transfer capacitance for improving switching loss under high frequency applications.

A power semiconductor device is provided in the present invention. The power semiconductor device has a base, a trench, a heavily doped polysilicon structure, a conductive structure, a gate dielectric layer, and a body. The trench is formed in the base. The heavily doped polysilicon structure is located in a lower portion of the trench and has at least a side surface connecting the base. The conductive structure is located in an upper portion of the trench. The gate dielectric layer is interposed between the conductive structure and the heavily doped polysilicon structure. The body is located in the base. The dopants in the heavily doped polysilicon structure are driven through at least the side surface thereof to form a heavily doped region in the base.

A fabrication method of a power semiconductor device is also provided in the present invention. The fabrication method comprises the steps of (a) providing a base; (b) forming a trench in the base; (c) forming a heavily doped polysilicon structure in a lower portion of the trench, and the heavily doped polysilicon structure having at least a side surface connecting the exposed base; (d) forming a gate dielectric layer covering at least an upper surface of the heavily doped polysilicon structure; (e) forming a conductive structure in an upper portion of the trench; and (f) applying a thermal drive-in step to diffuse dopants in the heavily doped polysilicon structure to form a heavily doped region encircling at least the side surface of the heavily doped polysilicon structure.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1A:
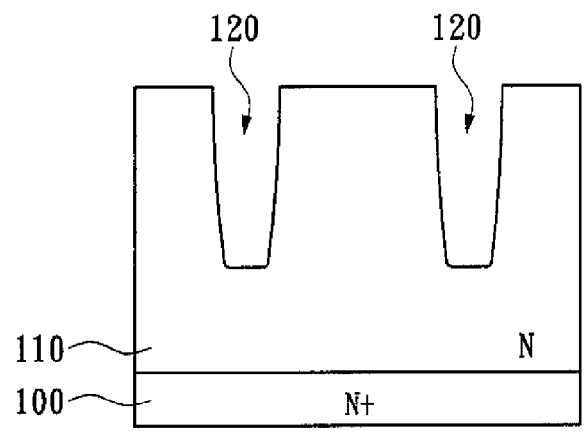
FIGS. 1A to 1G are schematic views showing a fabrication method of a trenched power semiconductor device in accordance with a first embodiment of the present invention.

FIGS. 1A to 1G are schematic views showing a fabrication method of a trenched power semiconductor device in accordance with a first embodiment of the present invention. As shown in FIG. 1A, firstly, an N-type substrate 100 is provided, and then an N-type epitaxial layer 110 is formed on the substrate 100 to form a base. Afterward, a trench 120 is formed in the epitaxial layer 110.

Figure 1B:
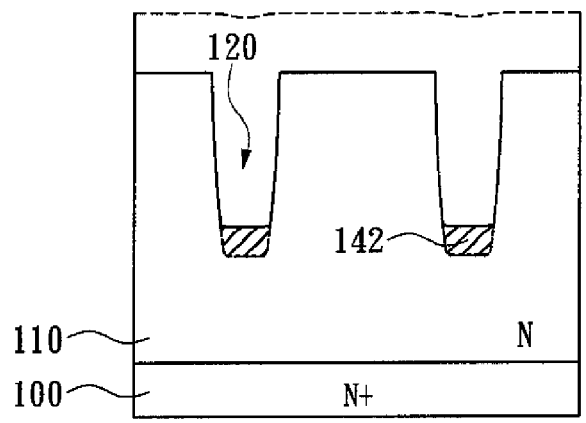

Next, as shown in FIG. 1B, a heavily doped polysilicon layer is deposited over the whole exposed surfaces as shown by the dashed line. Then, the unwanted portion is removed by etching to leave the heavily doped polysilicon structure 142 in the lower portion of the trench 120. Basically, the epitaxial layer 110, which is composed of single crystal material, has an etching speed lower than the polysilicon layer in the same etching environment. With doping concentration being properly adjusted, the etching speed of polysilicon material may reach 10 times the etching speed of epitaxial material. Thus, the polysilicon layer can be selectively etched even through the epitaxial layer 110 is exposed in the etching environment.

Figure 1C:
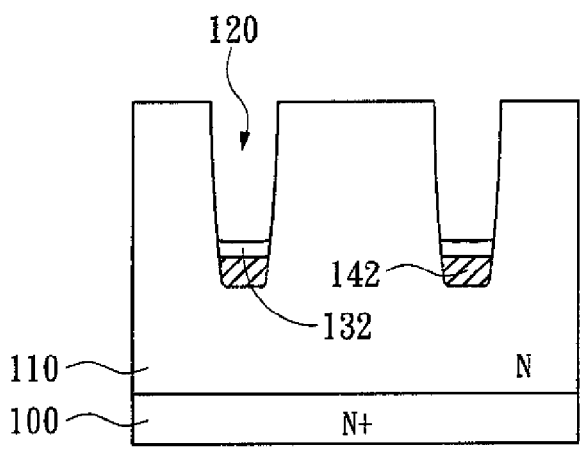
Figure 1D:
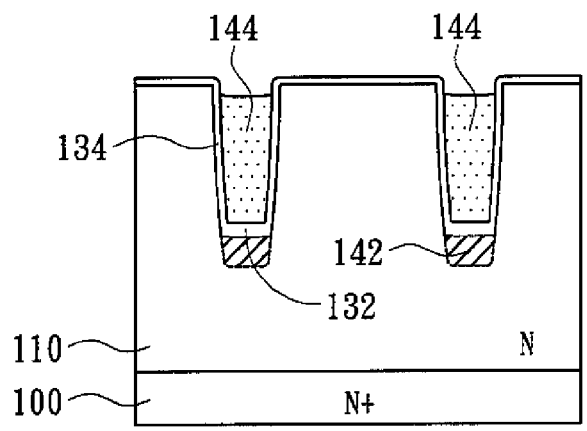

Afterward, as shown in FIG. 1C, a bottom dielectric layer 132 is formed on the upper surface of the heavily doped polysilicon structure 142. Then, as shown in FIG. 1D, a sidewall dielectric layer 134 is formed on the exposed sidewall of the trench 120. The above mentioned bottom dielectric layer 132 and the sidewall dielectric layer 134 compose the gate dielectric layer of the trenched power semiconductor structure. Thereafter, a conductive structure, such as a polysilicon gate 144, is formed in an upper portion of the trench 120. As shown, the heavily doped polysilicon structure 142 and the polysilicon gate 144 are separated by the bottom dielectric layer 132.

The fabrication process of the gate dielectric layer in accordance with the present embodiment is divided into two steps. Firstly, the thicker bottom dielectric layer 132 is formed on the upper surface of the heavily doped polysilicon structure 142. Then, the thinner dielectric layer 134 is formed on the sidewall of the trench 120. The thicker bottom dielectric layer 132 has the effect of reducing capacitance between gate and drain (Cgd).

Figure 1E:
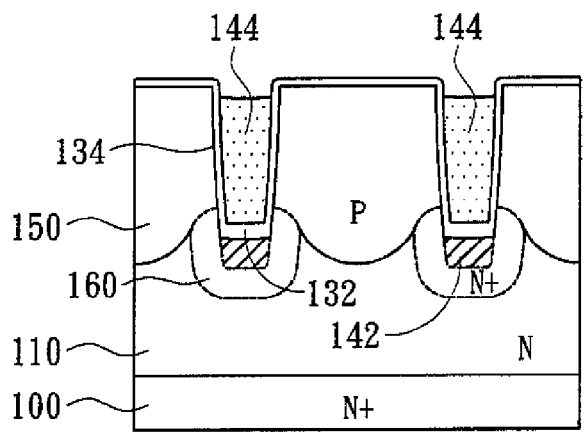
Figure 1F:
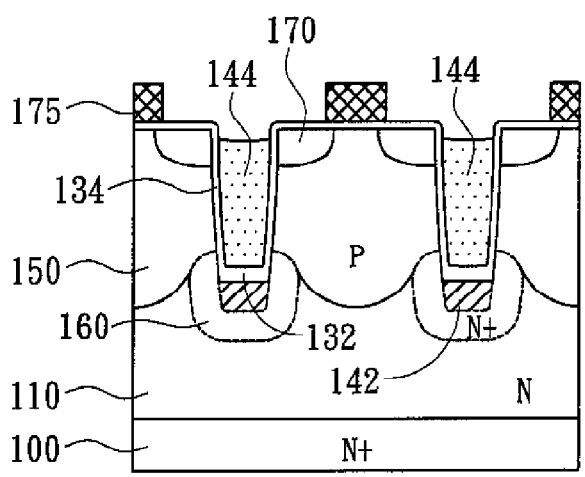
Figure 1G:
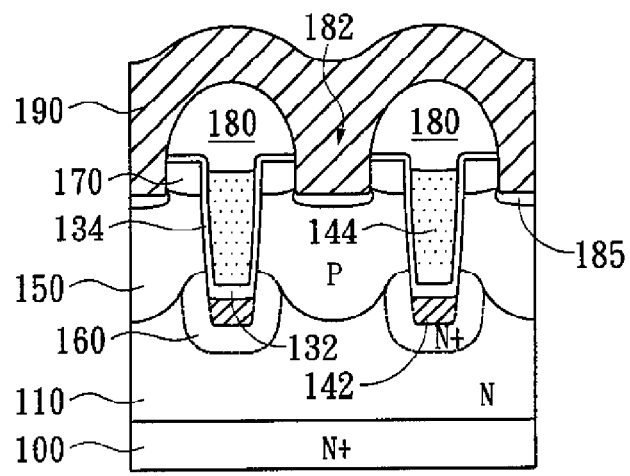

Next, as shown in FIG. 1E, an ion implantation step is carried out to implant P-type dopants into the epitaxial layer 110, and then a thermal drive-in step is used to diffuse the implanted P-type dopants so as to form the P-type body 150 between two neighboring trenches 120. The dopants in the heavily doped polysilicon structure 142 are also driven in the present thermal drive-in step and a heavily doped region 160 surrounding the heavily doped polysilicon structure 142 is resulted. In the present embodiment, the heavily doped polysilicon structure 142 is of N-type conductivity, and the N-type heavily doped region 160 is formed surrounding the heavily doped polysilicon structure 142. The N-type heavily doped region 160 is capable of preventing the bottom of the trench 120 from being shielded by the P-type body 150. Next, as shown in FIG. 1F, a photo-resist pattern 175 is formed on the P-type body 150 to define the location of source regions by using a source mask (not shown), and then a source ion implantation step is carried out to implant N-type dopants into the P-type body 150 so as to form N-type source regions 170 beside the trench 120. Thereafter, as shown in FIG. 1G, an interlayer dielectric layer 180, such as a BPSG layer or a PSG layer, is formed on the polysilicon gate 144. Afterward, a contact window 182 is defined in the interlayer dielectric layer 180 to expose the P-type body 150. The bottom of the contact window 182 is then implanted with P-type dopants to form a P-type heavily doped region 185. Finally, a source metal layer 190 is deposited on the interlayer dielectric layer 180 and fills the contact window 182 to electrically connect the source regions 170.

As mentioned above, the heavily doped polysilicon structure 142 is able to adjust the bottom profile of the P-type body 150 to prevent the lower surface of the trench 120 from being shielded by the P-type body 150. Therefore, a shallower gate trench 120 or a deeper body implantation step can be applied in the present invention. The usage of shallow trenches 120 is helpful for reducing input capacitance Ciss and the thick bottom dielectric layer 132 is helpful for reducing reverse transfer capacitance Crss. Thus, the present embodiment has the advantages of high switching speed and low switching loss.

Figure 2:
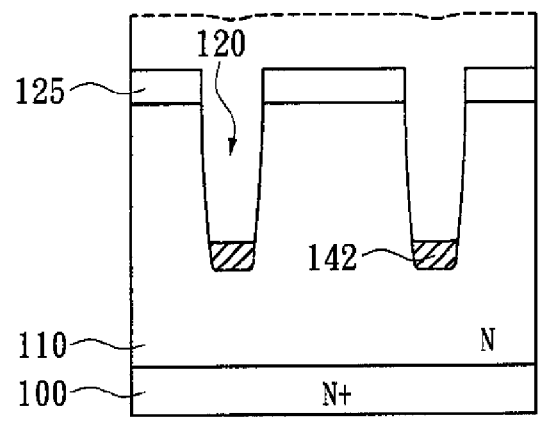
FIG. 2 is a schematic view showing a fabrication method of a trenched power semiconductor device in accordance with a second embodiment of the present invention.

FIG. 2 is a schematic view showing a fabrication method of the trenched power semiconductor device in accordance with a second embodiment of the present invention. In the present embodiment, the hard mask 125 is utilized for forming the trenches 120, and the following polysilicon deposition and etching steps are carried out with the hard mask 125 remained on the epitaxial layer 110. The hard mask 125 protects the epitaxial layer 110 therebelow from being etched in the polysilicon etching step.

Figure 3A:
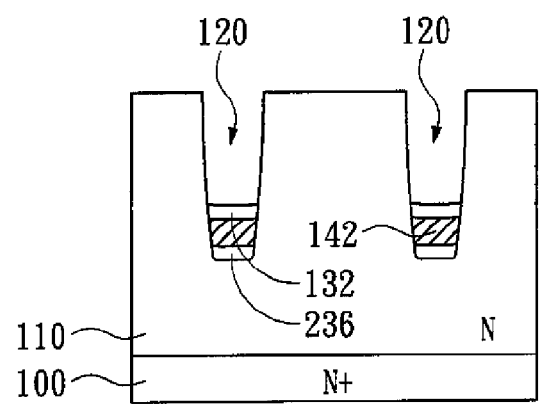
FIGS. 3A and 3B are schematic views showing a fabrication method of a trenched power semiconductor device in accordance with a third embodiment of the present invention.
Figure 3B:
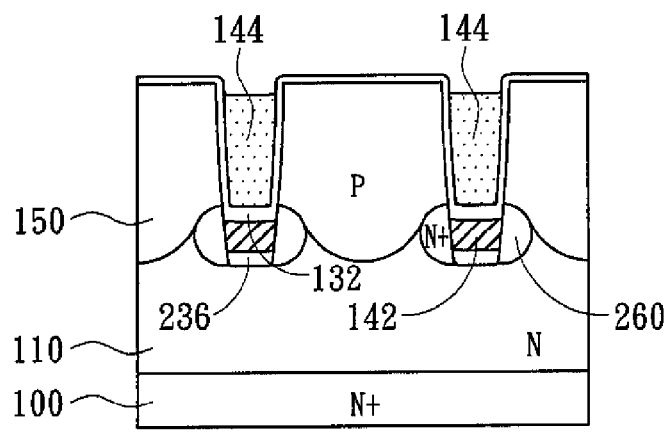

FIGS. 3A and 3B are schematic views showing a fabrication method of a trenched power semiconductor device in accordance with a third embodiment of the present invention. In contrast with the first embodiment of the present invention, which features a heavily doped polysilicon structure 142 with a lower surface thereof touching the epitaxial layer 110 as shown in FIG. 1G, the present embodiment has a first dielectric layer 236 formed at the bottom of the trench 120 prior to the formation of the heavily doped polysilicon structure 142 as shown in FIG. 3A such that the bottom of the heavily doped polysilicon structure 142 is covered by the first dielectric layer 236. The following fabrication steps of the present embodiment are similar to that of the first embodiment and thus are not repeated here. Although the heavily doped region 260 of the final structure of the present embodiment as shown in FIG. 3B merely surrounds the side surface of the heavily doped polysilicon structure 142 and leaves the bottom of the trench 120 unshielded, the effect of preventing the P-type body 150 from covering the bottom of the trench 120 can be still achieved.

Figure 4A:
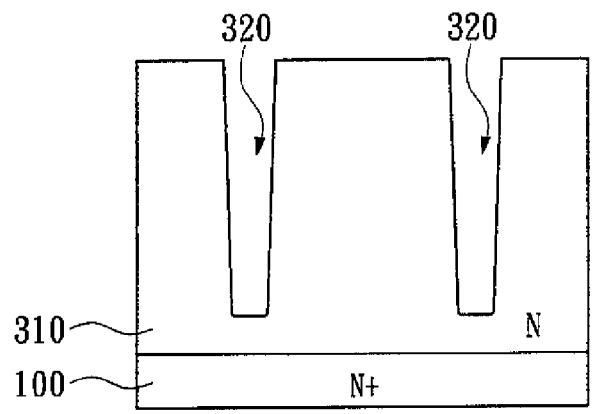
FIGS. 4A to 4C are schematic views showing a fabrication method of a trenched power semiconductor device in accordance with a fourth embodiment of the present invention.
Figure 4B:
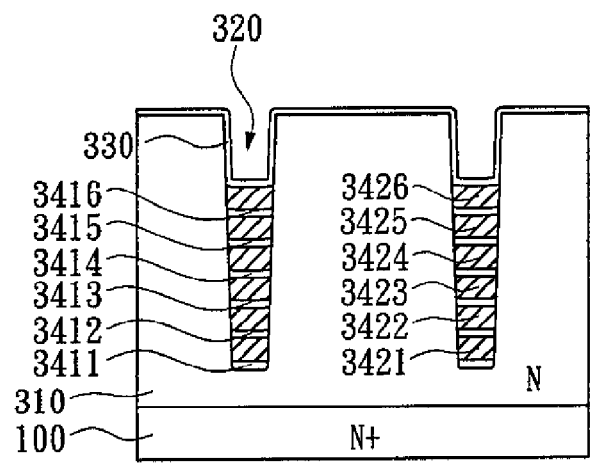
Figure 4C:
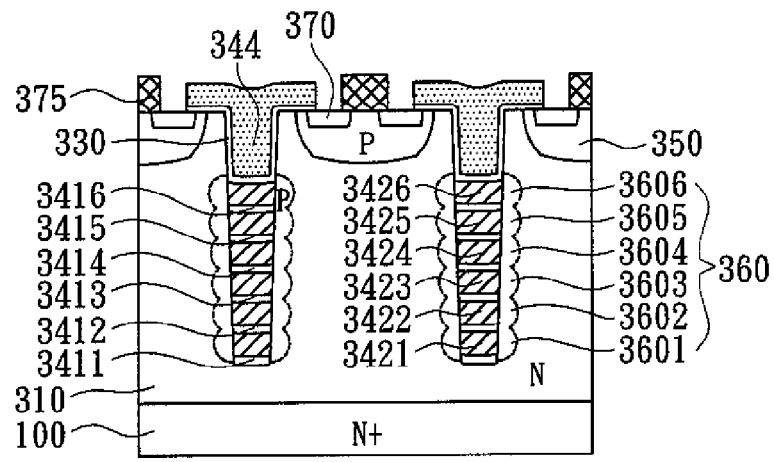

The above mentioned embodiments describe the technology provided in the present invention being applied to a typical trenched field effect transistor device. But the present invention is not so restricted. As shown in FIGS. 4A to 4C, the fourth embodiment of the present invention describes the technology of the present invention being applied to a high voltage trenched power semiconductor device with the so-called super junction structure.

As shown in FIG. 4A, firstly, a deep trench 320 is formed in the N-type epitaxial layer 310. Then, as shown in FIG. 4B, a first dielectric layer 3411, a first heavily doped polysilicon layer 3421, a second dielectric layer 3412, a second heavily doped polysilicon layer 3422, and etc., are formed in the deep trench 320 in a serial so as to form a stacked structure with a plurality of dielectric layers 3411, 3412, . . . 3416 sandwiched between a plurality of heavily doped polysilicon layers 3421, 3422, . . . 3426. The stacked structure with six heavily doped polysilicon layers is shown in the present embodiment as an example. The number of layers is not for restricting the scope of the present invention.

Afterward, as shown in FIG. 4B, a gate dielectric layer 330 is formed on the upper surface of the uppermost heavily doped polysilicon layer 3426. The gate dielectric layer 330 also lines the exposed sidewall of the deep trench 320. Thereafter, as shown in FIG. 4C, a T-shaped polysilicon gate 344 is formed in the deep trench 320. The T-shaped polysilicon gate 344 has a vertical portion filled into the upper portion of the deep trench 320 and a horizontal portion extended on the epitaxial layer 310.

Next, the T-shaped polysilicon gate 344 is utilized as a mask for implanting P-type dopants into the epitaxial layer 310, and then a thermal drive-in step is carried out to diffuse the implanted P-type dopants so as to form the P-type body 350 between two neighboring polysilicon gates 344. The present thermal drive-in step also drive the dopants in the heavily doped polysilicon layers 3421, 3422, . . . 3426 toward the neighboring epitaxial layer. Thus, a plurality of heavily doped sub-regions 3601, 3602, . . . 3606 is formed surrounding the respected heavily doped polysilicon layers 3421, 3422, . . . 3426, and these heavily doped sub-regions 3601, 3602, . . . 3606 are connected with each other. The following fabrication steps for forming the source doped regions and the contact window are similar to that of the above mentioned embodiment and thus are not repeated here.

In the present embodiment, the heavily doped polysilicon layers 3421, 3422, . . . 3426 are doped with P-type impurities so as to form the P-type heavily doped sub-regions 3601, 3602, . . . 3606. In addition, the P-type heavily doped sub-regions 3601, 3602, . . . 3606 are integrated to form a complete P-type heavily doped region 360 (or P well). However, the present invention is not so restricted. These P-type heavily doped region 360 may be composed of discrete heavily doped sub-regions 3601, 3602, . . . 3606 as long as the potential of the polysilicon gate 344 can be transferred along the P-type heavily doped sub-regions 3601, 3602, . . . 3606. Thereby, as the power semiconductor device is operated, the depletion region is formed between the P-type heavily doped region 360 and the P-type body 350, which are kept away with a predetermined distance, so as to enhance the withstanding voltage of the transistor.

Figure 5A:
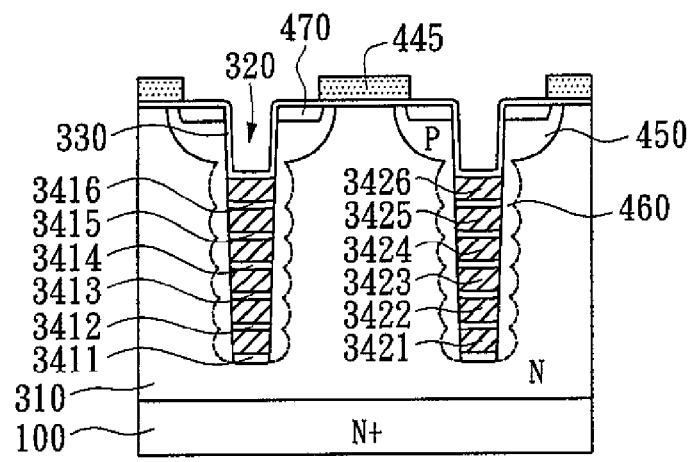
FIGS. 5A to 5C are schematic views showing a fabrication method of a trenched power semiconductor device in accordance with a fifth embodiment of the present invention.
Figure 5B:
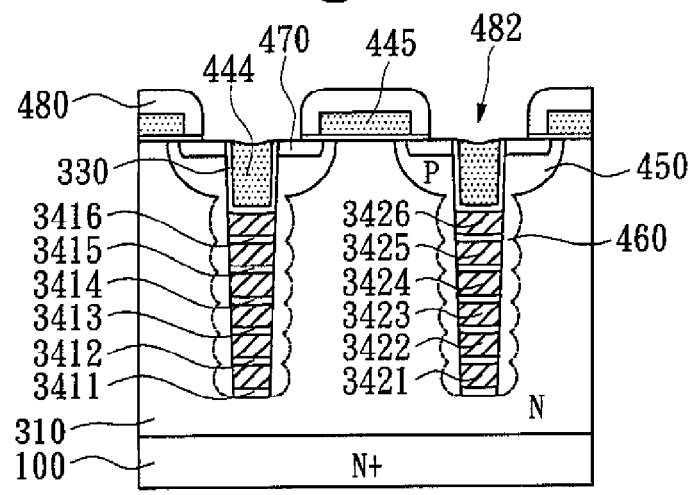
Figure 5C:
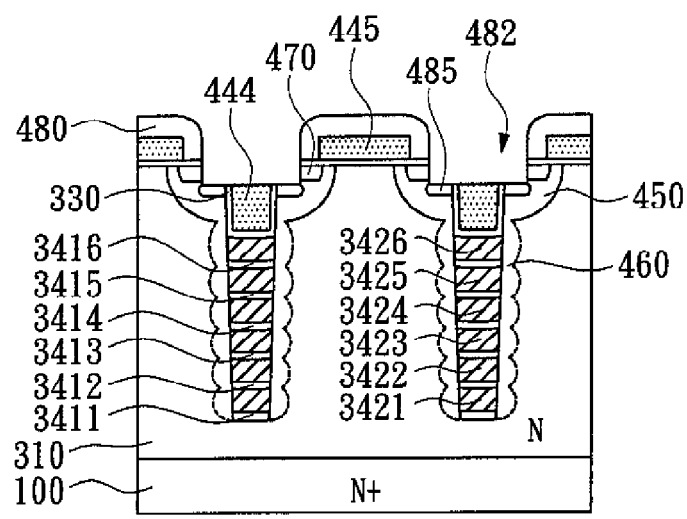

FIGS. 5A to 5C are schematic views showing a fabrication method of a power semiconductor device in accordance with a fifth embodiment of the present invention, and a high voltage power semiconductor device is described as an example.

The fabrication step of FIG. 5A follows the step of FIG. 4B of the above mentioned embodiment. As shown, after the formation of the gate dielectric layer 330, the polysilicon gate 445 is formed on the upper surface of the epitaxial layer 310. The polysilicon gate 445 may be fabricated by using the typical polysilicon lithographic and etching technology. Thereafter, the polysilicon gate 445 is utilized as a mask for implanting P-type dopants into the epitaxial layer 310 so as to form the P-type body 450 surrounding the upper portion of the trench 320. Then, another ion implantation step is carried out with the polysilicon gate 445 as an implantation mask for implanting N-type dopants into the epitaxial layer 310 to form N-type source doped regions 470 in the P-type body 450.

Thereafter, as shown in FIG. 5B, an interlayer dielectric layer 480 is formed on the polysilicon gate 445 to define a contact window 482 over the P-type body 450. As shown, the contact window 482 is substantially aligned to the trench 320 and has a width greater than that of the trench 320. Afterward, a polysilicon structure 444 is filled into the upper portion of the trench 320. Then, as shown in FIG. 5C, the epitaxial layer 310 is etched through the contact window 482 to expose the P-type body 450 below the N-type source doped region 470. Thereafter, an ion implantation step is carried out to implant P-type dopants through the contact window 482 so as to form a P-type heavily doped region 485 at the bottom of the contact window 482. Finally, a source metal layer is deposited on the interlayer dielectric layer 480. The source metal layer electrically connects the source doped region 470 and the polysilicon structure 444 through the contact windows 482.

In the fourth embodiment of the present invention, the polysilicon gate 344 is located in the trench 320 and aligned to the heavily doped polysilicon structure composed of a plurality of heavily doped polysilicon layers 3421, 3422, . . . 3426. In contrast, the polysilicon gate 445 of the present embodiment is formed on the upper surface of the epitaxial layer 310, and the heavily doped polysilicon structure is aligned to the P-type body 450. The P well 460 encircling the heavily doped polysilicon structure is connected to the P-type body 450 such that the depletion region formed between the two neighboring P wells 460 can be utilized for enhancing withstanding voltage of the transistor.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A power semiconductor device, comprising:
a base of a first conductive type;
a trench, formed in the base;
a heavily doped polysilicon structure, located in a lower portion of the trench, and has at least a side surface attaching the base directly;
a conductive structure, located in an upper portion of the trench;
a gate dielectric layer, interposed between the conductive structure and the heavily doped polysilicon structure; and
a body of a second conductive type, located in the base;
wherein dopants in the heavily doped polysilicon structure are diffused through at least the side surface thereof to form a heavily doped region in the base.

2. The power semiconductor device of claim 1, further comprising a dielectric layer, located at a bottom of the trench, and a bottom of the heavily doped polysilicon structure being covered by the dielectric layer.

3. The power semiconductor device of claim 1, wherein the heavily doped polysilicon structure is of the first conductive type.

4. The power semiconductor device of claim 1, wherein the heavily doped polysilicon structure is of the second conductive type.

5. The power semiconductor device of claim 4, wherein the heavily doped region is connected to the body.

6. The power semiconductor device of claim 1, wherein the heavily doped polysilicon structure is a stacked structure with a plurality of heavily doped polysilicon layers separated by at least a dielectric layer.

7. The power semiconductor device of claim 6, wherein the heavily doped region is composed of a plurality of heavily doped sub-regions with respective to the heavily doped polysilicon layers, and at least a portion of the heavily doped sub-regions are connected with each other.

8. The power semiconductor device of claim 1, wherein the conductive structure is a polysilicon gate.

9. The power semiconductor device of claim 1, wherein the conductive structure is electrically connected to a source electrode.

10. A fabrication method of a power semiconductor device, comprises the steps of
(a) providing a base of a first conductive type;
(b) forming a trench in the base;
(c) forming a heavily doped polysilicon structure in a lower portion of the trench, and the heavily doped polysilicon structure having at least a side surface touching the base;
(d) forming a gate dielectric layer covering at least an upper surface of the heavily doped polysilicon structure;
(e) forming a conductive structure in an upper portion of the trench; and
(f) applying a thermal drive-in step to diffuse dopants of the heavily doped polysilicon structure to form a heavily doped region encircling at least the side surface of the heavily doped polysilicon structure.

11. The fabrication method of a power semiconductor device of claim 10, before the step of forming the heavily doped polysilicon structure, further comprising the step of forming a dielectric layer at a bottom of the trench.

12. The fabrication method of a power semiconductor device of claim 10, wherein the thermal drive-in step is also utilized to form a body of a second conductive type.

13. The fabrication method of a power semiconductor device of claim 10, wherein the heavily doped polysilicon structure is of the first conductive type.

14. The fabrication method of a power semiconductor device of claim 10, wherein the heavily doped polysilicon structure is of a second conductive type.

15. The fabrication method of a power semiconductor device of claim 14, wherein the step of forming the heavily doped polysilicon structure comprises:
forming a first heavily doped polysilicon layer in the trench;
forming a first dielectric layer covering the first heavily doped layer; and
forming a second heavily doped polysilicon layer on the first dielectric layer.

16. The fabrication method of a power semiconductor structure of claim 10, wherein the conductive structure is a polysilicon gate.

17. The fabrication method of a power semiconductor structure of claim 10, further comprising the step of depositing a source metal layer electrically connecting the conductive structure.

* * * * *